(12) United States Patent
Rosemore et al.

(10) Patent No.: US 9,721,720 B2
(45) Date of Patent: Aug. 1, 2017

(54) POWER USE REDUCTION TRANSFORMER

(71) Applicants: Timothy Andrew Rosemore, Reno, NV (US); James Blakeley Owings, Dahlonega, GA (US)

(72) Inventors: Timothy Andrew Rosemore, Reno, NV (US); James Blakeley Owings, Dahlonega, GA (US)

(73) Assignee: Main Street Energy, LLC, Reno, NV (US)

( * ) Notice: Subject to any disclaimer, the term of this patent is extended or adjusted under 35 U.S.C. 154(b) by 71 days.

(21) Appl. No.: 14/490,398

(22) Filed: Sep. 18, 2014

(65) Prior Publication Data

US 2015/0222175 A1 Aug. 6, 2015

Related U.S. Application Data

(60) Provisional application No. 61/879,526, filed on Sep. 18, 2013.

(51) Int. Cl.
| | |
|---|---|
| *H01F 27/29* | (2006.01) |
| *H01F 30/16* | (2006.01) |
| *H01F 17/02* | (2006.01) |
| *H03H 1/00* | (2006.01) |
| *H01F 27/06* | (2006.01) |
| *H03H 7/09* | (2006.01) |

(52) U.S. Cl.
CPC ............ *H01F 30/16* (2013.01); *H01F 17/02* (2013.01); *H01F 27/29* (2013.01); *H03H 1/00* (2013.01); *H01F 2027/065* (2013.01); *H03H 7/09* (2013.01); *H03H 2001/005* (2013.01); *H03H 2001/0092* (2013.01)

(58) Field of Classification Search
CPC ............................................ H01F 27/00–27/36
USPC ................................................ 336/90–96, 192
See application file for complete search history.

(56) References Cited

U.S. PATENT DOCUMENTS

| | | | | |
|---|---|---|---|---|
| 1,997,599 | A * | 4/1935 | Pierce ...................... | H03H 9/62 318/118 |
| 3,194,908 | A * | 7/1965 | Clifford ................. | H01H 71/08 200/284 |
| 3,579,044 | A * | 5/1971 | Phillips, Jr. ............. | H01F 27/06 174/545 |
| 3,742,305 | A * | 6/1973 | Hobson, Jr. .............. | H02H 3/33 361/115 |
| 4,845,380 | A * | 7/1989 | Piegari ..................... | H05K 7/18 307/149 |
| 5,179,491 | A * | 1/1993 | Runyan .................. | H01H 73/08 335/18 |
| 6,791,211 | B1 * | 9/2004 | Flegel .................... | H01H 73/08 307/113 |
| 2003/0011441 | A1 * | 1/2003 | Merriman ................ | H04B 3/56 333/100 |

(Continued)

*Primary Examiner* — Tuyen Nguyen
(74) *Attorney, Agent, or Firm* — Miller, Matthias & Hull LLP

(57) ABSTRACT

A power conditioning device reduces capacitive-in-nature, out of phase current (verses voltage), non-linear distortion, and/or leading power factor "noise" in electrical current in an electrical panel, improving the power efficiency of devices connected to the panel. The physical and electrical specifications of the device allow it to be more easily installed and give it a more robust installation environment.

5 Claims, 3 Drawing Sheets

(56) References Cited

U.S. PATENT DOCUMENTS

2003/0099078 A1* 5/2003 Parlee .................. H02J 13/002
  361/117
2008/0151463 A1* 6/2008 Dwyer .................. H01H 47/32
  361/186

* cited by examiner

_US 9,721,720 B2_

POWER USE REDUCTION TRANSFORMER

TECHNICAL AREA

The disclosed principles relate generally to power usage reduction, and, more particularly, to systems and methods that reduces capacitive, out of phase current, non-linear distortion, and/or leading power factor noise in electrical current in a typical electrical panel that results in the reduction in power demand.

BACKGROUND OF THE INVENTION

Over the course of the last decade there has been a substantial increase in the number of electrical devices in residential and commercial facilities that utilize switched-mode power supplies. The switched-mode power supplies associated with these non-linear loads typically have rated output powers ranging from a few watts to more than 1 Â kW. Historically, low-cost power supplies incorporated a simple full-wave rectifier that conducted only when the mainline's instantaneous voltage exceeded the voltage on the input capacitors. This resulted in very high ratios of peak-to-average input current, which also resulted in a low distortion power factor and potentially serious phase and neutral loading concerns.

A typical switched-mode power supply first generates a DC bus voltage using a bridge rectifier or similar circuit. The usable output voltage is then derived from this DC bus by switching and retransformation. The problem with this configuration is that the rectifier is a non-linear device, and so the input current is highly non-linear. That means that the input current has energy at harmonics of the frequency of the voltage. In an alternating current (AC) electrical system, the energy (related to both current and voltage) that is not attenuated by the load flows onto the return side of the circuit that is joined to the neutral from the street transformer. As the AC cycles, the distorted energy flows back through the load causing the load to be less efficient and consume more power. Attempts to solve this problem have been either very complex hot side systems or token systems that lack the proper electrical characteristics to properly function.

DETAILED DESCRIPTION OF THE INVENTION

As noted above, there has been a substantial increase in the number of switched-mode power supplies in both residential and commercial facilities, and these nonlinear loads pull an input current that is highly non-linear. This in turn results in a distorted energy flows back through the load, causing the load to be less efficient and consume more power.

The system described herein provides physical and electrical characteristics, including carefully configured inductance and resistance values, that ameliorate the power losses caused by nonlinear loads while also providing ease of installation and a robust installation environment. In overview, the system filters, in a particular way, the capacitive-in-nature, out of phase current (as measured against voltage phase), non-linear distortion, and leading power factor noise in an electrical current in a typical electrical network or circuit, causing the loads in the circuit to consume less power.

Moreover, the system operates not at the hot side of the power circuit but at the return side. Thus, rather than focus on improving the quality of the power delivered to a load from the power producer, the disclosed system filters noise introduced into the power circuit by load devices. The disclosed system is also a passive system that is simple to install on the neutral bus, rather than the hot side of the power circuit. Moreover, the disclosed system accommodates a wide range of electrical environments so that sizing is not critical as it often is in hot side systems. By using energy present on the neutral side of the circuit, the system is able to reduce non-linear distortion/noise in the power circuit. Moreover, the simple configuration and installation of the disclosed system reduces problems caused by variations in manufacturing or installation.

Figure 1:
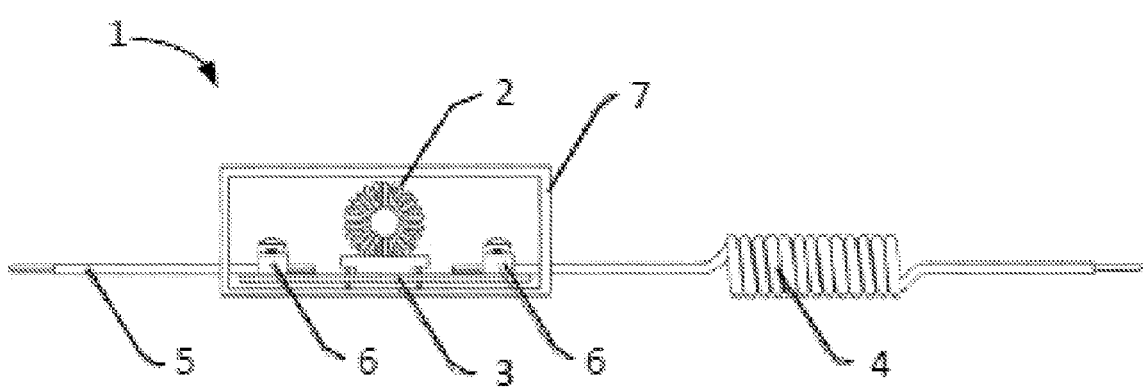
FIG. 1 is a component schematic according to an embodiment of the disclosed system.

The system is designed and manufactured to inductance and resistance specifications that allow the device to be more easily installed and gives it a more robust installation environment. The components of the illustrated example system 1 of FIG. 1 include a transformer 2, a printed circuit board 3, a coiled lead 4, a straight lead 5, lead terminals 6, and an enclosure 7.

The transformer 2 is mounted on a circuit board 3, which is itself then mounted in the enclosure 7. Though not shown, the device 1 may also include shielding, internally or externally, to shield it from electrical fields. The circuit board 3 is covered with a ground plane that is electrically divided into two surfaces. The resistance of the connections, ground planes, and leads is less than or equal to the resistance of the transformer 2. This condition must exist in order to more easily mount the device in a parallel condition that exposes the device to capacitive-in-nature, out of phase current (verses voltage), non-linear distortion, and/or leading power factor noise in an electrical current in a typical electrical network or circuit.

The transformer 2 is joined to and/or mounted on the circuit board by passing the transformer leads through mounting holes in the circuit board 3 and soldering the leads on to the electrically divided ground plane. The straight lead 5 and a coiled lead 4 which are used to put the device 1 in circuit in a load panel are attached to each side of the circuit board 3 ground plane using lead terminals 6 and solder. To further increase the device's inductance, the straight lead 5 may be replaced with a coiled lead.

To install the device in an electrical panel, one lead is connected to the main neutral lug in the panel where the main neutral lead coming from the street terminates in the load panel. The other lead is then installed, creating a parallel neutral path, on the neutral buss bar using a lug furthest away from where the neutral main attaches to the neutral buss bar.

In operation, the device 1 acts as a filter with a combination of high inductance and low resistance. The high inductance and low resistance values allow the device, when installed in a parallel circuit in a load panel, to cause the capacitive-in-nature, out of phase current (verses voltage), non-linear distortion, and/or leading power factor noise in an electrical current to flow into the transformer 2. The noise is dissipated as it travels through the transformer 2 windings and is exposed to the transformer 2 core. The coiled lead 4 is used to add inductance to the device. The resistance of the connections, ground planes, and leads is less than or equal to the resistance of the transformer 2.

The filtering out of the indicated current distortions in a typical electrical network or circuit causes the loads in the circuit to consume less power. In simpler terms, when the current that is outside the fundamental frequency is removed from the circuit, the loads operates more efficiently, thereby reducing the electrical power consumed.

Figure 2A:
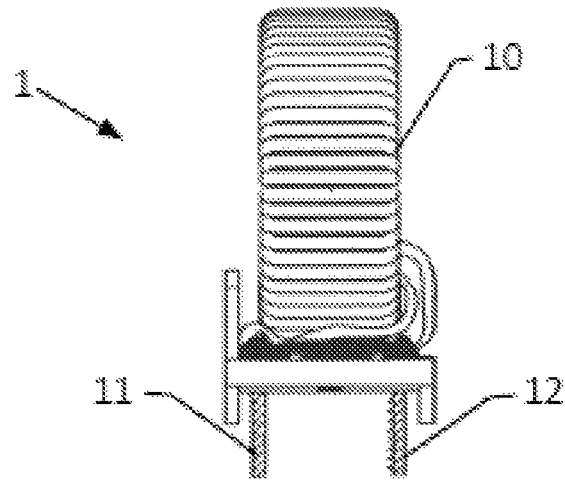
FIG. 2A is an end view of an inductive coil according to an embodiment of the disclosed system.
Figure 2B:
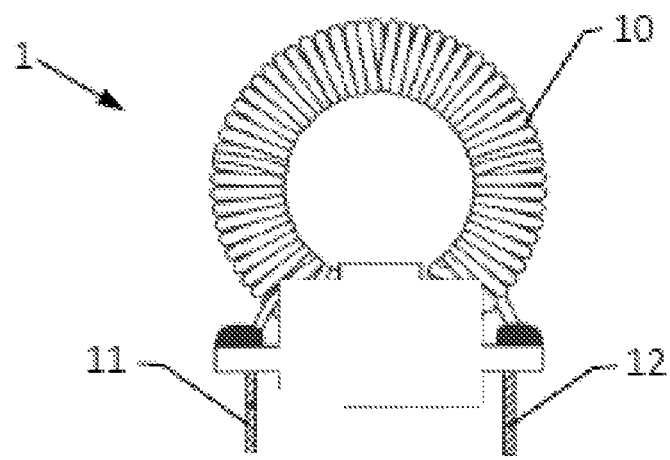
FIG. 2B is a side view of an inductive coil according to an embodiment of the disclosed system.

Turning to FIG. 2A and FIG. 2B, these figures illustrate a suitable transformer 1 in greater detail. The transformer 1 includes a core (not visible through windings) wound with a suitable winding material 10 in an annular shape. The transformer 1 includes a plurality of leads therefrom, including a first lead 11 and a second lead 12.

Figure 3:
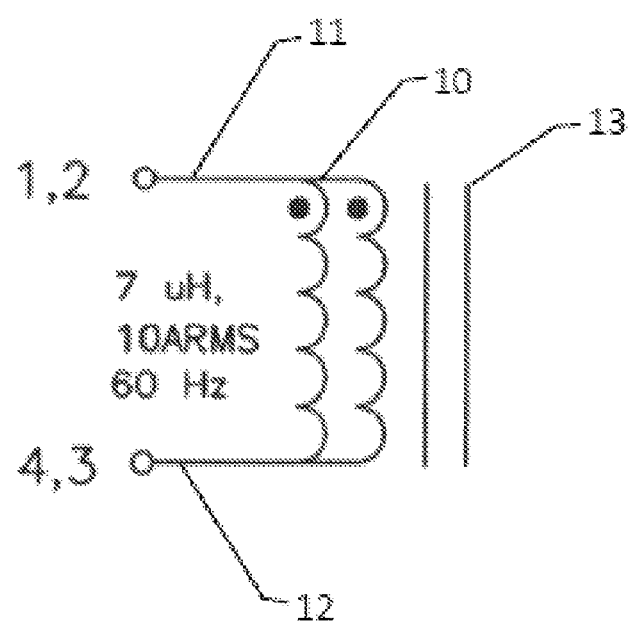
FIG. 3 is a circuit diagram of a component of the disclosed system.

FIG. 3 shows the transformer 1 schematically. The windings 10 of the transformer 1 are associated electromagnetically and locationally with the core 13 as shown. The leads 11, 12 are shown emanating from the windings.

As noted above, the device may include other non-interfering optional components such as EMF shielding, and certain modifications may be made if desired, e.g., replacing the straight lead 5 with a coiled lead. Moreover, a transformer with a higher level of inductance coupled with a lower resistance could be used to further improve the functionality of the device. While the illustrated device is able to be retrofitted to an existing panel, it will be appreciated that the device may instead be integrated into the load panel during manufacture or installation.

Similarly, although the illustrated components are arranged in a particular order in the figure, the arrangement of the components into a different order may be made as long as the high inductance and low resistance of the device are maintained. While the device may be installed across the neutral buss lugs as discussed above, other installation locations are possible. For example, the device can still form a parallel path with all or part of the neutral buss bar or neutral main circuit from a different location. Moreover, it is also possible for the device to be installed on the neutral side of a power strip or a power receptacle.

We claim:

1. A power conservation system comprising:
    an electrical power panel having a neutral buss;
    a printed circuit board;
    a high inductance transformer mounted to the printed circuit board; and
    a first lead and a second lead connected to the transformer, wherein the second lead is coiled to increase its inductance, and wherein the first and second leads are connected across the neutral buss of the electrical power panel creating a parallel neutral path on the neutral buss bar.

2. The power conservation system in accordance with claim 1, wherein the electrical power panel is a household electrical power panel.

3. The power conservation system in accordance with claim 1, wherein the electrical power panel is an industrial electrical power panel.

4. The power conservation system in accordance with claim 1, wherein the device further comprises EMF shielding to shield at least the transformer.

5. The power conservation system in accordance with claim 1, wherein the device further comprises a lead connector between each of the first and second leads and the transformer.

* * * * *